(12) United States Patent
Wen et al.

(10) Patent No.: US 10,038,170 B2
(45) Date of Patent: Jul. 31, 2018

(54) METHOD FOR CUTTING DISPLAY PANEL

(71) Applicant: EVERDISPLAY OPTRONICS (SHANGHAI) LIMITED, Shanghai (CN)

(72) Inventors: Chih-wei Wen, Shanghai (CN); Denghui Liu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 103 days.

(21) Appl. No.: 15/159,153

(22) Filed: May 19, 2016

(65) Prior Publication Data
US 2017/0084879 A1    Mar. 23, 2017

(30) Foreign Application Priority Data

Sep. 23, 2015   (CN) .......................... 2015 1 0609160

(51) Int. Cl.
*H01L 51/56*   (2006.01)
*B24B 9/06*   (2006.01)
(Continued)

(52) U.S. Cl.
CPC .............. *H01L 51/56* (2013.01); *B24B 9/065* (2013.01); *B24B 55/02* (2013.01); *B28D 5/022* (2013.01);
(Continued)

(58) Field of Classification Search
CPC ......... B24B 7/228; B24B 7/241; B24B 9/065; B24B 21/002; B24B 55/02; B28D 5/022;
(Continued)

(56) References Cited

U.S. PATENT DOCUMENTS 7,372,069 B2 *   5/2008   Frischknecht ...... H01L 51/5243
                                                                257/40
9,691,824 B2 *   6/2017   Gao ........................ H01L 51/52
(Continued)

FOREIGN PATENT DOCUMENTS

CN         200964772 Y       10/2007
CN         103619537 A        3/2014
(Continued)

OTHER PUBLICATIONS

The 1st office action issued in the counterpart CN application No. 201510609160.0 dated Feb. 26, 2018, by the SIPO.

*Primary Examiner* — Timothy V Eley
(74) *Attorney, Agent, or Firm* — Yunling Ren

(57) ABSTRACT

A method for cutting a display panel is provided by the disclosure. The display panel includes a substrate, a cover plate provided opposite to the substrate, multiple display components sandwiched between the substrate and the cover plate, and encapsulation glue sandwiched between the substrate and the cover plate and surrounding the multiple display components. The method includes: forming multiple display modules by cutting the substrate and the cover plate of the display panel at a position between adjacent display components; and edging a display module obtained through the cutting with an edging machine by a distance from an edge of the display module to inward of the encapsulation glue, until the encapsulation glue is grinded to a preset width. A design of slim bezel can be achieved for the display panel with high accuracy by the method for cutting the display panel according to the disclosure.

15 Claims, 8 Drawing Sheets

(51) Int. Cl.
*B28D 5/02* (2006.01)
*B28D 7/02* (2006.01)
*B24B 55/02* (2006.01)
*H01L 51/52* (2006.01)

(52) U.S. Cl.
CPC ............ *B28D 7/02* (2013.01); *H01L 51/5246* (2013.01); *H01L 2251/566* (2013.01)

(58) Field of Classification Search
CPC ....... B28D 7/02; H01L 51/5246; H01L 51/56; H01L 2251/566
See application file for complete search history.

(56) References Cited

U.S. PATENT DOCUMENTS

| | | | |
|---|---|---|---|
| 2004/0135268 A1 | 7/2004 | Frischknecht | |
| 2010/0155247 A1* | 6/2010 | Cao | C08L 21/00 204/600 |
| 2014/0235742 A1* | 8/2014 | Cho | C09J 163/00 522/31 |
| 2014/0319497 A1* | 10/2014 | Cho | C09J 163/00 257/40 |
| 2016/0126492 A1* | 5/2016 | Kyoung | H01L 51/5246 257/40 |
| 2016/0248037 A1* | 8/2016 | Liu | H01L 51/56 |
| 2017/0062759 A1* | 3/2017 | Gai | H01L 51/5246 |
| 2017/0247582 A1* | 8/2017 | Keite-Telgenbuscher | C09J 11/06 |
| 2017/0317157 A1* | 11/2017 | Li | H01L 27/3276 |

FOREIGN PATENT DOCUMENTS

| | | |
|---|---|---|
| CN | 103730604 A | 4/2014 |
| CN | 103985826 A | 8/2014 |
| CN | 104409652 A | 3/2015 |
| CN | 204463733 U | 7/2015 |

* cited by examiner

METHOD FOR CUTTING DISPLAY PANEL

CROSS REFERENCE TO RELATED APPLICATION

This application is based on and claims priority to Chinese Patent Application No. 201510609160.0, filed on Sep. 23, 2015, the entire contents of which are incorporated herein by reference.

TECHNICAL FIELD

The present disclosure relates to the field of display technologies, and more particularly, to a method for cutting a display panel.

BACKGROUND

Organic light-emitting diode (OLED) display panels are widely used due to advantages such as self-illumination, high brightness and wide view angle. Such display panels, however, need to be encapsulated for isolation from oxygen and moisture, since they may malfunction because of liable chemical reaction between oxygen, moisture and OLED material. Frit can be preferably used for isolation from oxygen and moisture and thus is frequently used in manufacture of the OLED display panels for encapsulation such that they can be isolated from oxygen and moisture.

As far as a display panel of a mobile terminal (e.g., a cell phone or a tablet computer) is concerned, a design of slim bezel has become a mainstream trend where a width of the bezel is reduced for miniaturization without changing size of a light emission area of the display panel. With the design of slim bezel, a ratio of the light emission area can be increased and both brightness and saturation of images within visible area can be improved. Moreover, a total width of the mobile terminal can be efficiently reduced by adopting the slim bezel. And especially for cell phones, better holding feeling may be brought by a cell phone with slim bezel.

In manufacture of the OLED display panels, the frit glue requires to be narrowed down for implementing the design of slim bezel. When the design of slim bezel is implemented by directly narrowing down the frit glue in encapsulation process, it is necessary to apply the frit glue with a relatively small width uniformly and continuously, which brings forward strict requirements on the encapsulation process. Moreover, since the encapsulation process is performed through fusion and then solidification of the frit glue, discontinuity of the frit glue or a hollow region may be generated when the frit glue is too narrow, which may further impact isolation effect of the encapsulation as well as light emission and life span of the OLED display panel.

In addition, a cut OLED display panel shall be cut again with a cutter to remove redundant substrate and cover plate so as to realize the design of slim bezel. Generally, as an OLED display panel may be not cut off through cutting with the cutter, and manual delamination is always required after the cutting, tiny cracks may be generated at edge profile of the OLED display panel, which will deteriorate strength of the OLED display panel.

The foregoing information is merely disclosed to facilitate understanding of background of the present disclosure. Therefore, the foregoing information may include information not constituting the prior art known to those of ordinary skill in the art.

SUMMARY

The present disclosure provides a method for cutting a display panel to achieve a design of slim bezel for the display panel.

According to one aspect of the present disclosure, there is provided a method for cutting a display panel. The display panel includes a substrate, a cover plate provided opposite to the substrate, multiple display components sandwiched between the substrate and the cover plate, and encapsulation glue sandwiched between the substrate and the cover plate and surrounding the multiple display components. The method includes: forming multiple display modules by cutting the substrate and the cover plate of the display panel at a position between adjacent display components; and edging a display module obtained through the cutting with an edging machine by a distance from an edge of the display module to inward of the encapsulation glue, until the encapsulation glue is grinded to a preset width.

In an embodiment, the edging machine includes a grinding tool, and the step of edging a display module obtained through the cutting with an edging machine includes: enabling the grinding tool to contact against the edge of the display module; and moving the grinding tool and/or display module relatively to each other, such that the edge of the display module contacting against the grinding tool is grinded by the grinding tool.

In an embodiment, the step of moving the grinding tool and/or the display module relatively to each other includes: moving the display module along a direction opposite to a grinding direction; and moving the grinding tool along a direction perpendicular to the grinding direction.

In an embodiment, the step of moving the grinding tool and/or the display module relatively to each other includes: moving the grinding tool along a grinding direction; and moving the display module along a direction perpendicular to the grinding direction.

In an embodiment, a grinding precision of the grinding tool is configured as 20 μm.

In an embodiment, the grinding tool is a grinding wheel or a cutter having a certain roughness, and a shape of the cutter can be selected based on a sectional profile of the display module.

In an embodiment, the step of edging a display module obtained through the cutting with an edging machine further includes: cooling a grinding position with coolant.

In an embodiment, the step of cooling a grinding position with coolant includes: spraying the coolant onto the grinding position via a nozzle.

In an embodiment, there is an interval space between the encapsulation glue surrounding any two adjacent display components, and the step of cutting the substrate and the cover plate of the display panel includes: cutting the substrate and the cover plate of the display panel with a cutter at the interval space.

In an embodiment, the cutter is selected from a group including a toothed cutter, a toothless cutter, a cutter wheel and a combination thereof.

In an embodiment, the encapsulation glue is made from frit or a composite of frit.

In an embodiment, the preset width ranges from 200 μm to 600 μm.

In an embodiment, the substrate and/or the cover plate are made of glass.

According to another aspect of the present disclosure, there is provided a method for cutting a display panel. The display panel includes a substrate, a cover plate provided opposite to the substrate, a display component sandwiched between the substrate and the cover plate, and encapsulation glue sandwiched between the substrate and the cover plate. The method includes: edging the display panel with an edging machine by a distance from an edge of the display panel to inward of the encapsulation glue, until the encapsulation glue is grinded to a first width.

BRIEF DESCRIPTION OF THE DRAWINGS

By referring to detailed description of the drawings and exemplary embodiments, the foregoing and other characteristics and advantages of the present disclosure will become more apparent.

Figure 1:
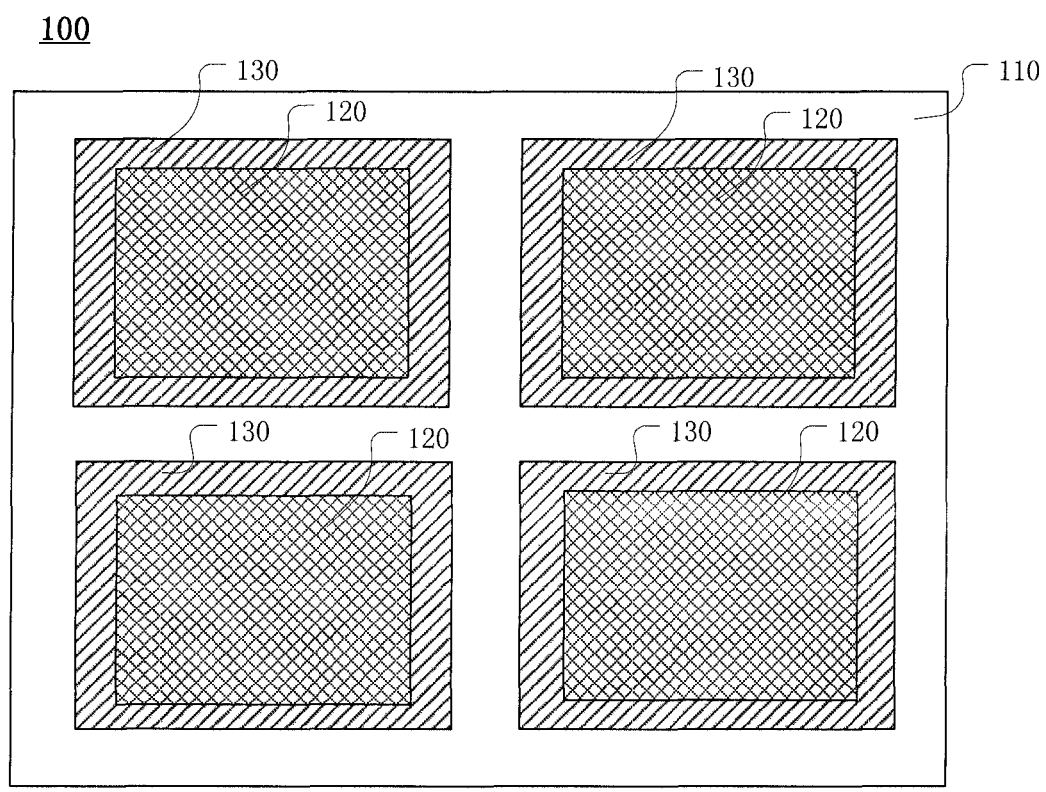
FIG. 1 is a block diagram illustrating a display panel according to an embodiment of the disclosure.

Reference numbers throughout the drawings denote as follows.

100 Display panel
110 Substrate
120 Display component
130 Encapsulation glue
140 Cover plate
150 Interval
160 LTPS (Low Temperature Poly-Silicon) layer
100' Display module
100" Edged display module
200 Cutter
300 Grinder
310 Grinding position
D Width
X Grinding direction

DETAILED DESCRIPTION

Description will now be made in detail to exemplary embodiments by reference to the accompanying drawings. However, the exemplary embodiments may be implemented in various ways rather than being understood as limited to those embodiments described herein. Instead, those embodiments are provided to illustrate the disclosure comprehensively and completely, and to deliver concept of the exemplary embodiments entirely to those skilled in the art. Like elements are represented by like reference signs in the drawings, and detailed description thereof may be omitted.

Furthermore, features, structures or properties described herein may be combined into one or more embodiments in any proper ways. Detailed description will be made hereinafter to enable the embodiments of the disclosure to be comprehensible. However, it should be noted for those skilled in the art, technical solution of the disclosure may be implemented by means of alternative structures, materials or processes instead of one or more of those specific elements described herein. Otherwise, structures, processes or operations well known in the art may be not illustrated or described herein for fear of obscuring aspects of the disclosure.

The drawings of the disclosure are only for illustrative purpose of relative positions among parts, so layer thickness of some parts is exaggeratedly depicted for easier understanding rather than being representative a ratio of actual layer thickness. Upper and lower layers in the disclosure may be in direct contact with each other or may be in non-direct contact with but corresponding to each other.

Figure 2:
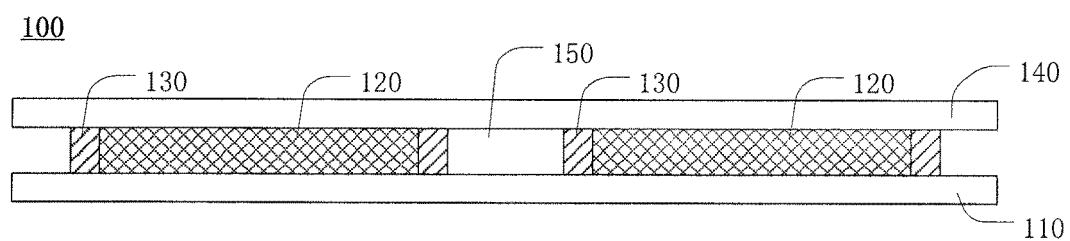
FIG. 2 is a section view illustrating a display panel according to an embodiment of the disclosure.
Figure 3:
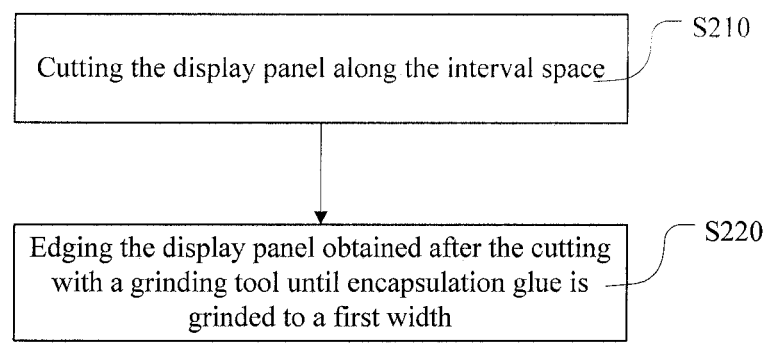
FIG. 3 is a flow chart illustrating a method for cutting a display panel according to an embodiment of the disclosure.
Figure 4:
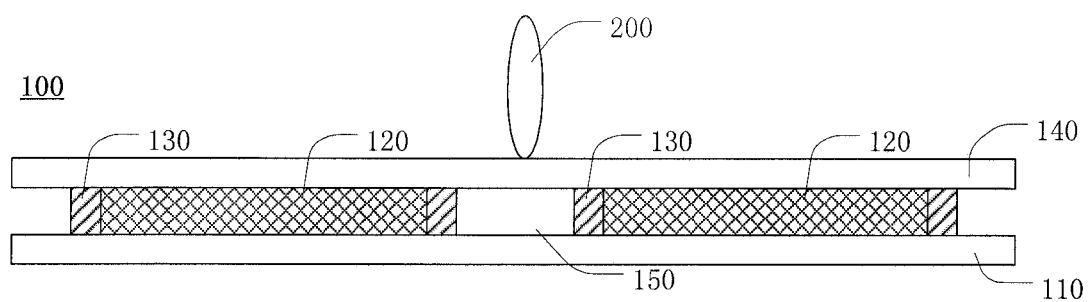
FIG. 4 is a schematic diagram illustrating cutting of a display panel according to an embodiment of the disclosure.
Figure 5:
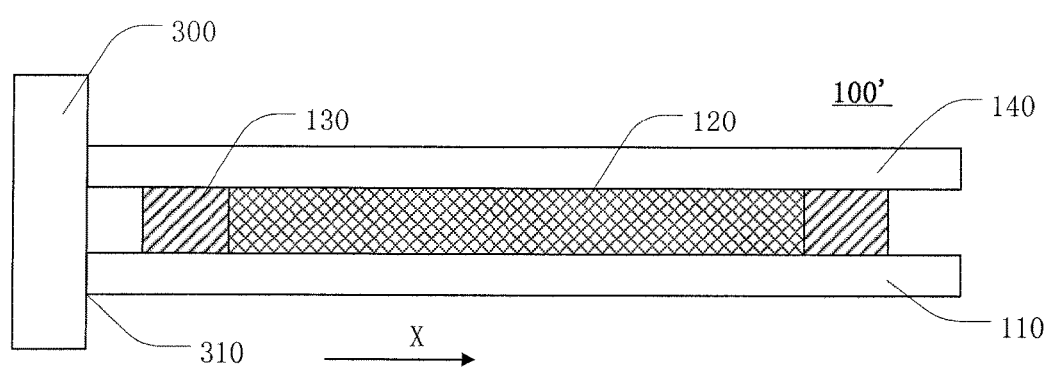
FIG. 5 is a schematic diagram illustrating edging of a display module according to an embodiment of the disclosure.
Figure 6:
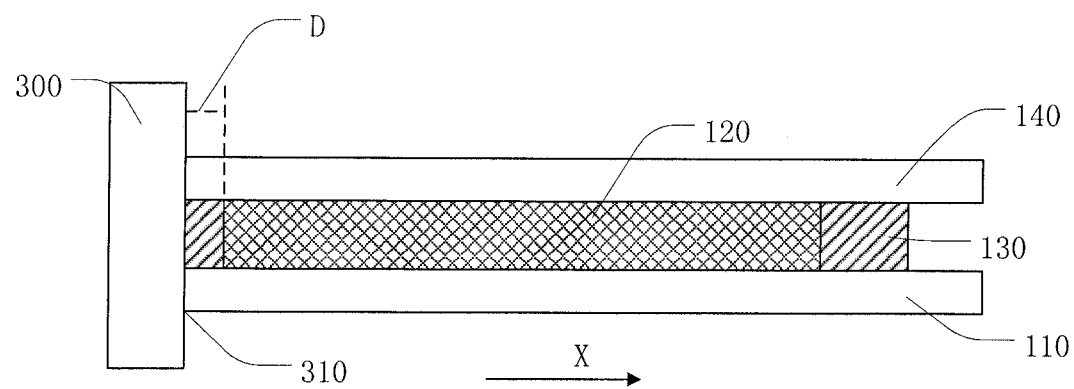
FIG. 6 is a schematic diagram illustrating edging of a display module according to an embodiment of the disclosure.

A method for cutting a display panel is provided by the disclosure so as to implement a design of slim bezel for the display panel. Referring to block diagrams illustrating an uncut display panel as shown in FIGS. 1 and 2, the display panel 100 includes a substrate 110, a cover plate 140 provided opposite to the substrate 110, multiple display components 120 and encapsulation glue 130. In an embodiment, both the substrate 110 and the cover plate 140 are glass plates.

The multiple display components are sandwiched between the substrate 110 and the cover plate 140. Any adjacent two of the display components 120 may be spaced by a certain interval instead of adjoining each other. In an embodiment, the multiple display components 120 are arranged in a matrix on the substrate 110. In an alternative embodiment, the multiple display components 120 may be arranged in a staggered way on the substrate 110. In the embodiment, the display components 120 are in the shape of rectangle. In some alternative embodiments, the display components 120 may be formed in other shapes such as circles or triangles. Each one of the display components 120 may include a pixel array. The pixel array may include a plurality of pixels arranged in form of matrix, honeycomb, or the like. In an embodiment, the display components 120 are OLED display components which include a number of OLEDs for emitting light.

The encapsulation glue 130 is located between the substrate 110 and the cover plate 140 and is used for surrounding the multiple display components 120, respectively. There may be an interval space 150 between the encapsulation glue 130 surrounding any adjacent two of the display components 120. In other words, each one of the display components 120 can be surrounded by the encapsulation glue 130. In an embodiment, a peripheral shape of the encapsulation glue 130 is identical to the shape of a display component 120 surrounded by the same. In an embodiment of the disclosure, the encapsulation glue 130 is made from frit or a composite of frit. When being used for encapsulation of the display component 120, the frit glue should typically be melted and coated before being solidified for encapsulation. An initial coating width of the frit glue may be configured depending on actual manufacturing process and properties of the frit glue, such that the frit glue can be maintained at a uniform height in process of solidification after being melted. In other words, with such initial coating width, there should be no gap at contact surfaces between solidified frit glue and either the substrate 110 or the cover plate 140, thus isolated encapsulation of the display panel 100 can be achieved such that the display 100 can be protected from intrusion of external moisture and oxygen.

Referring to FIGS. 3-6 illustrating the method for cutting the display panel provided by the disclosure, the method may include following two steps.

In step S210, the display panel 100 may be cut along the interval space 150.

In an embodiment, the display panel 100 is cut with a cutter 200 to form a plurality of display modules 100'. The cutter 200 can be selected from a group including a toothed cutter, a toothless cutter, a cutter wheel, or a combination thereof. In some embodiments, the cutter 200 may be driven by a driving device for placing the cutter 200 at the interval space 150 of the display panel 100 for cutting the same, such that the multiple display components 120 can be divided to form the plurality of display modules 100'.

In step S220, a cut display module 100' may be edged with a edging machine by a distance from an edge of the display module 100' to inward of the encapsulation glue 130, until the encapsulation glue 130 is grinded to a preset width D.

In an embodiment, the edging machine includes a grinding tool 300. In some embodiments, the grinding tool may be a grinding wheel, or may be a cutter having a certain roughness with a shape selected based on a sectional profile of the display module 100'. The grinding tool 300 may press against the edge of the display module 100', and a relative movement is caused between the grinding tool 300 and the display module 100', such that the edge of the display module 100' contacting against the grinding tool 300 is grinded by the same.

In an embodiment, the display module 100' is placed on a platform which is able to move the display module 100' along a direction opposite to a grinding direction X. Meanwhile, the grinding tool 300 may be driven by a driving unit of the edging machine to move along a direction perpendicular to the grinding direction X. In the illustrated embodiment, the direction perpendicular to the grinding direction X is a direction inwardly and outwardly perpendicular to the paper.

In another embodiment, the display module 100' is placed on a platform which is able to move the display module 100' along a direction perpendicular to the grinding direction X. At the same time, the grinding tool 300 may be driven by a driving unit of the edging machine to move along the grinding direction X. In the illustrated embodiment, the direction perpendicular to the grinding direction X is a direction inwardly and outwardly perpendicular to the paper.

In above two embodiments, the display module 100' and the grinding tool 300 are moved along two directions perpendicular to each other, such that the edge of the display module 100' can be grinded by the grinding tool 300.

It should be understood that, any one of the above two embodiments may be implemented to perform edging process for a display module 100' with a straight edge. For a display module 100' with a curved edge, however, the edging process may be implemented such that a movement direction of the display module 100' or the grinding 300 is identical to a tangential direction of the edge of the display module 100'. For example, when a circular display module 100' is involved, the edge of the circular display module 100' may be pressed against the grinding tool 300 and the circular display module 100' may be rotated around its center, such that the edging process can be implemented by moving the grinding tool 300 to approach the circular display module 100' along the grinding direction.

In practical terms, heat may be generated at a grinding position 310 in the grinding process due to the relative movement between the grinding tool 300 and the display module 100'. When the grinding tool is moved to grind the frit glue 130, the frit glue 130 may be melted because of excessive heat, and thus gaps may be further generated at contact surfaces between the frit glue 130 and either the substrate 110 or the cover plate 140, such that even isolated encapsulation of the display module 100's may be impacted. Accordingly, in an embodiment of the disclosure, the grinding position 310 can be cooled with coolant. For example, the coolant may be stored in a tank of the edging machine, and the grinding position 310 can be cooled by spraying the coolant via a nozzle aiming at the grinding position 310. In an embodiment, there are 4 nozzles for spraying the coolant onto the grinding position 310. The number of nozzles, however, may vary depending on size of the display module 100'.

Furthermore, a manner of grinding the edge of the display panel 100' with the grinding tool 300 is adopted instead of cutting and delamination, thus tiny cracks can be reduced at sectional surface of the panel. In addition, grinding output can be determined according to the original coating width and the preset width D of the frit glue 130 with relatively high grinding precision of the edging machine, facilitating determination of reserved width for the frit glue with higher accuracy. In an embodiment, the grinding precision of the edging machine is configured as 20 μm, the original coating width ranges from 300 μm to 800 μm, and the preset width D ranges from 200 μm to 600 μm.

To sum up, according to the grinding process in the disclosure, the frit glue needs not to be narrowed down with accurate control in the encapsulation process, instead, an encapsulation width suitable for achieving a desirable encapsulation effect can be selected depending on properties of the frit glue. After that, the grinding output may be determined according to width requirement of encapsulated bezel. Accordingly, the frit glue can be grinded with a smooth edge, and a desirable encapsulation effect can be achieved.

Figure 7:
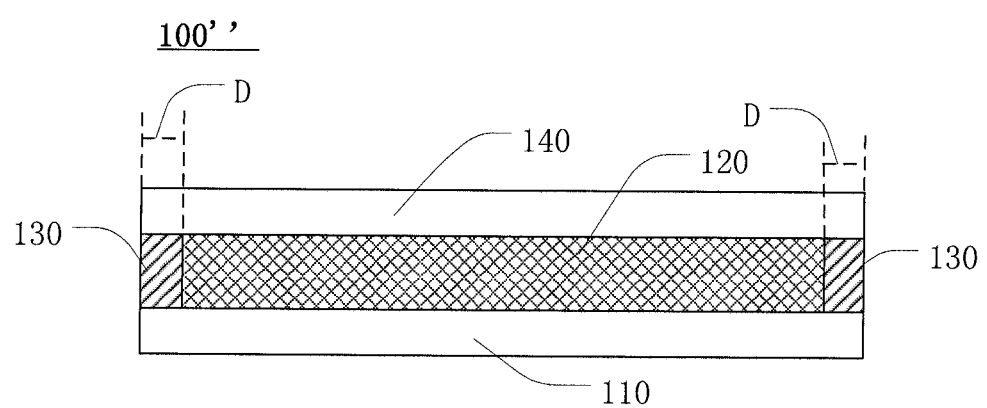
FIG. 7 is a block diagram illustrating an edged display module according to an embodiment of the disclosure.
Figure 8:
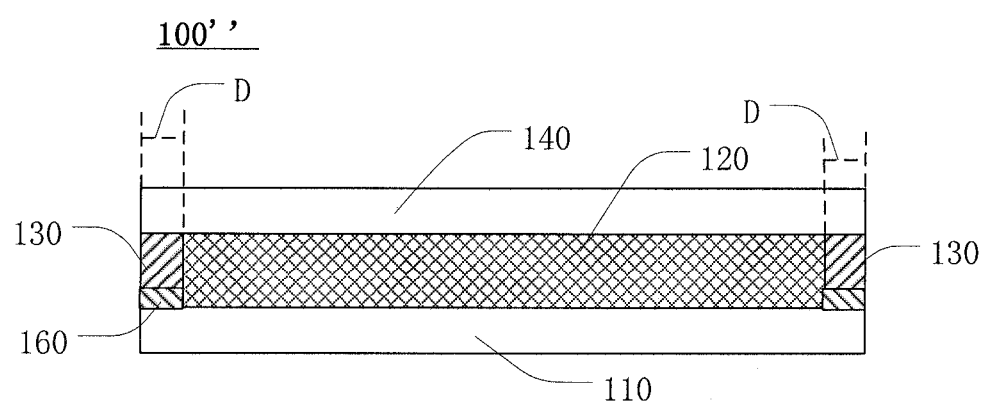
FIG. 8 is a block diagram illustrating an edged display module according to another embodiment of the disclosure.

Embodiments of an edged display module 100" will be described with reference to FIGS. 7 and 8.

In an embodiment, the edged display module 100" includes a substrate 100, a cover plate 140 provided opposite to the substrate 110, a display component 120 and encapsulation glue 130. Herein, there may be one display component 120 sandwiched between the substrate 100 and the cover plate 140. The encapsulation glue 130 may be also sandwiched between the substrate 100 and the cover plate 140 and used for surrounding the display component 120. Outer edge of the encapsulation 130 and outer edges of both the substrate 100 and the cover plate may lie in a same plane. The encapsulation glue 130 can have a preset width D.

In another embodiment, the edged display module 100" also includes an LTPS (Low Temperature Poly-Silicon) layer 160. The LTPS layer 160 is provided at least between the substrate 100 and the encapsulation 130. The LTPS layer 160 provided between the substrate 100 and the encapsulation 130 can be used to form a TFT (Thin Film Transistor) for driving the display component 120 or other electronic devices.

Following advantageous effects may be achieved according to the present disclosure.

1. The encapsulation glue is grinded to the preset width by edging the display panel, such that a design of slime bezel can be achieved for the display panel while ensuring isolated encapsulation thereof.

2. Tiny cracks at sectional surface of the display panel can be reduced by edging the display panel instead of cutting and delamination, such that strength stability can be improved.

3. The encapsulation glue can be prevented from being melted due to excessive heat generated in grinding by cooling the grinding position of the display panel with coolant, such that sectional surfaces of the encapsulation glue can be kept flat.

To sum up, according to the method of the disclosure, processing difficulty can be reduced while encapsulation effect can be improved, and requirement of slim bezel can be achieved with higher accuracy.

The disclosure has been described by reference to the embodiments above which are merely examples for implementing the disclosure. It should be noted that the present disclosure is not limited to the exact embodiments that have been described above. Instead, various modifications and changes can be made without departing from concept and scope of the disclosure and should be covered by protection scope thereof.

What is claimed is:

1. A method for cutting a display panel, the display panel comprising a substrate, a cover plate provided opposite to the substrate, multiple display components sandwiched between the substrate and the cover plate, and encapsulation glue sandwiched between the substrate and the cover plate and surrounding the multiple display components, the method comprising:

forming multiple display modules by cutting the substrate and the cover plate of the display panel at positions between any two adjacent ones of the multiple display components, each one of the multiple display modules corresponding to one of the multiple display components; and edging, using an edging machine, a display module selected from the multiple display modules from an edge of the display module toward encapsulation glue surrounding a corresponding display component, until the encapsulation glue is grinded to a preset width.

2. The method as claimed in claim 1, wherein the edging machine comprises a grinding tool, and the step of edging the display module comprises:

enabling the grinding tool to contact against the edge of the display module; and moving at least one of the grinding tool and the display module, such that the edge of the display module contacting against the grinding tool is grinded by the grinding tool.

3. The method as claimed in claim 2, wherein the step of moving the at least one of the grinding tool and the display module comprises:

moving the display module along a direction opposite to a grinding direction; and moving the grinding tool along a direction perpendicular to the grinding direction.

4. The method as claimed in claim 2, wherein the step of moving the at least one of the grinding tool and the display module comprises:

moving the grinding tool along a grinding direction; and moving the display module along a direction perpendicular to the grinding direction.

5. The method as claimed in claim 2, wherein the display module is in shape of a circle, the step of moving the at least one of the grinding tool and the display module comprises:

rotating the display module around a center of the circle; and moving the grinding tool to approach the display module along a grinding direction.

6. The method as claimed in claim 2, wherein a grinding precision of the grinding tool is configured as 20 μm.

7. The method as claimed in claim 2, wherein the grinding tool is a grinding wheel or a cutter having a certain roughness, a shape of the cutter being selected based on a sectional profile of the display module.

8. The method as claimed in claim 1, wherein the step of edging the display module further comprises:

cooling a grinding position with coolant.

9. The method as claimed in claim 8, wherein the step of cooling a grinding position with coolant comprises:

spraying the coolant onto the grinding position via a nozzle.

10. The method as claimed in claim 1, wherein an interval space is provided between encapsulation glue surrounding any two adjacent ones of the multiple display components, and the step of cutting the substrate and the cover plate of the display panel comprises:

cutting the substrate and the cover plate of the display panel with a cutter at the interval space.

11. The method as claimed in claim 10, wherein the cutter is selected from a group comprising a toothed cutter, a toothless cutter and a cutter wheel.

12. The method as claimed in claim 1, wherein the encapsulation glue is made from material comprising frit.

13. The method as claimed in claim 1, wherein the preset width ranges from 200 μm to 600 μm.

14. The method as claimed in claim 1, wherein the substrate and/or the cover plate is made of glass.

15. The method as claimed in claim 1, further comprising:

providing a low temperature poly silicon LTPS layer at least between the substrate and the encapsulation glue.

* * * * *